(12) United States Patent
Gallavan

(10) Patent No.: US 8,339,272 B2
(45) Date of Patent: Dec. 25, 2012

(54) CIRCUIT BREAKER LOCATOR

(75) Inventor: Michael F. Gallavan, Edmonds, WA (US)

(73) Assignee: Fluke Corporation, Everett, WA (US)

( * ) Notice: Subject to any disclaimer, the term of this patent is extended or adjusted under 35 U.S.C. 154(b) by 612 days.

(21) Appl. No.: 12/537,873

(22) Filed: Aug. 7, 2009

(65) Prior Publication Data

US 2011/0032111 A1    Feb. 10, 2011

(51) Int. Cl.
G08B 21/00    (2006.01)
G01R 19/00    (2006.01)
G01R 31/28    (2006.01)

(52) U.S. Cl. ........ 340/659; 340/686.6; 324/67; 324/528

(58) Field of Classification Search .................. 340/659, 340/686.6; 324/67, 528
See application file for complete search history.

(56) References Cited

U.S. PATENT DOCUMENTS

| | | | |
|---|---|---|---|
| 6,222,358 B1 * | 4/2001 | Wottrich | 324/67 |
| 2001/0033469 A1 * | 10/2001 | Macbeth et al. | 361/42 |
| 2003/0169051 A1 * | 9/2003 | Tallman et al. | 324/523 |
| 2004/0008018 A1 * | 1/2004 | Miller et al. | 324/67 |
| 2004/0136124 A1 * | 7/2004 | Engel et al. | 361/42 |

OTHER PUBLICATIONS

"Amprobe® Model ECB50A: Circuit Breaker Finder and AC Cable Tracer" © 2007 Amprobe® Test Tools, <http://www.amprobe.com/cgi-bin/pdc/viewprod.cgi?pid=2355&tid=1&type=elec> [retrieved Dec. 3, 2009], 4-page brochure.

Fernandes, K., et al., "Sherlock Breaker Problem Statement," <http://www.ece.msstate.edu/courses/design/ece4512/2004_fall/circuit_breaker/probstat_rev1.pdf>, and "Executive Summary," <http://www.ece.msstate.edu/courses/design/ece4512/2004_fall/circuit_breaker/ex_sum1.pdf>, [both retrieved Dec. 18, 2009], Mississippi State University, ECE 4512: EE Senior Design I, Sep. 2004, 4 pages.

* cited by examiner

*Primary Examiner* — George Bugg
*Assistant Examiner* — Jack K Wang
(74) *Attorney, Agent, or Firm* — Christensen O'Connor Johnson Kindness PLLC

(57) ABSTRACT

An arrangement that includes a transmitter unit and a receiver for locating a wire or a circuit interrupter associated with a selected branch circuit of a power distribution system. The transmitter is electrically interconnected with the selected branch circuit and produces a sequence of current pulses in a branch circuit that is to be traced to locate an associated circuit interrupter. Each current pulse is of a predetermined duration, a predetermined rise time, and a predefined fall time, which in one embodiment is equal to the current pulse rise time. The receiver is a handheld unit that is positioned in close proximity with the various circuit interrupters of the power distribution system and provides an indication that the desired wire or circuit interrupter has been located upon detecting current pulses that are with a predefined pulse duration, pulse separation and amplitude.

11 Claims, 9 Drawing Sheets

CIRCUIT BREAKER LOCATOR

RELATED APPLICATION

The present application is related to U.S. patent application Ser. No. 12/537,878, titled AC VOLTAGE PHASE DISCRIMINATOR FOR CIRCUIT BREAKER LOCATORS, filed Aug. 7, 2009, which is herein incorporated by reference in its entirety.

BACKGROUND

The present invention relates in general to electrical-test equipment used for tracing conductors and identifying electrical circuit elements. More particularly, the present invention relates to test equipment for identifying a circuit interrupter (e.g., circuit breaker or fuse) that is associated with a particular branch circuit of an electrical wiring system.

The electrical systems of homes, offices and other buildings consist of a plurality of branch circuits that originate at one or more power distribution panels. To protect against overload currents, each branch circuit includes a circuit interrupter (circuit breaker or fuse) that is installed in the power distribution panel associated with that particular branch circuit. Thus, the power distribution panels typically include a number of circuit interrupters. Most electrical distribution systems provide single or three phase AC power. However, some buildings, boats and ships employ DC power distribution systems or distribution systems that include both AC and DC branch circuits.

Situations arise in which it is necessary to locate the circuit interrupter that is associated with a particular AC or DC branch circuit. For example, when electrical work that is associated with a particular branch circuit is to be performed, it is usually necessary to interrupt electrical power to that branch circuit without interrupting power to other branch circuits. It is common practice to include legends that associate each circuit interrupter with a branch circuit when an electrical system is first installed or one or more branch circuits are added. For example, many power distribution panels include a hinged cover plate having a diagram of the layout of the circuit interrupters and a space for handwritten identification of the area, appliance or other electrical load that is served by that branch circuit. However, it is not unusual for the written legends to be illegible because of the passage of time or poor penmanship. Additionally, in some cases, the legend may not be specific enough to clearly identify the branch circuit of concern or, in some cases, may be incorrect.

Various methods and devices have been developed to avoid the tedious and often undesirable procedure of manually tripping circuit breakers (or removing fuses) until power is not supplied to an electrical outlet or socket that is located in a branch circuit that is to be de-energized.

One type of device that has been developed for locating circuit interrupters includes a relatively small transmitter unit and a handheld receiver. The transmitter unit is plugged into an electrical outlet or installed in a socket that is located in the branch circuit that is to be traced to a circuit interrupter. In many cases, the transmitter is a relaxation oscillator in which a semiconductor device such as a voltage controlled switch (e.g., a SIDAC) or a semiconductor circuit such as a diac triggered thyristor is switched to a conductive state to rapidly charge a capacitor. The rapid charging of the capacitor causes a current spike of relatively short duration to propagate through the branch circuit to which the transmitter is connected. As current through the capacitor decreases, the switch circuit resets and the capacitor discharges through a current path that is provided within the transmitter. Thus, the transmitter periodically induces current pulses in the associated branch circuit with the pulse repetition rate being determined by the RC time constant of the capacitor that induces the current spike and the resistance of the capacitor discharge path.

The receivers that are used in the transmitter-receiver arrangements for locating circuit interrupters typically are battery powered devices that include a sensor coil ("pickup coil") and usually are broadly tuned for receiving signals at the transmitter pulse repetition rate. In operation, the handheld receivers are placed in close physical proximity to the electrical system circuit interrupters so that maximum electromagnetic coupling occurs between a selected circuit interrupter and the receiver pickup coil. Typically the receiver includes a variable gain stage and other circuitry that drives audible and/or visual indicators [such as a piezoelectric beeper and/or light emitting diode (LED)] that are activated in response to received current pulses.

Power distribution panels position the branch circuits and circuit interrupters in relatively close proximity to one another. Thus, a current pulse induced in a particular branch circuit is electromagnetically coupled to closely proximate branch circuits and to associated circuit interrupters. Moreover, current fluctuations may be present in branch circuits other than the one being traced. As a result, the audible and/or visual indicators of a receiver may be energized when the receiver pickup coil is positioned adjacent more than one of the circuit interrupters. One technique that has been used to overcome multiple and false receiver indications is to manually decrease the gain of the receiver variable gain stage until a single circuit interrupter is identified. Other techniques that have been used to reduce false receive indications include using a transmitter pulse repetition rate significantly lower than the frequency of the AC branch current to minimize interference from light dimmers and other devices and using transmitter pulse repetition rates that are located between harmonic frequencies of the AC branch current.

Although arrangements for locating circuit interrupters associated with particular branch circuits of an electrical distribution system have met with a degree of commercial success, a need exists for improved reliability and ease of use performance so as to minimize the presence of false indications.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The invention includes a small transmitter and a handheld battery powered receiver. The transmitter is electrically interconnected with a branch circuit that is to be traced to locate a wire onto which one or more tracing signals such as current pulses are induced and/or an associated circuit interrupter among a plurality of circuit interrupters that are located in a power distribution panel. In operation, the transmitter is plugged into a conventional electrical outlet or installed in an electrical socket that receives power via the branch circuit being traced. The transmitter periodically induces a sequence of current pulses in the branch circuit being traced, with each current pulse being of a predetermined time duration, during which the current pulse increases linearly during a predetermined rise time, remains at a maximum current value for a predetermined time, and then decreases linearly with a fall time equal to the current pulse rise time. The handheld receiver is positioned proximate individual circuit interrupters to detect the current pulses induced by the transmitter. An audible and/or visual signal is provided by the receiver when it is located proximate the circuit interrupter that is associated with the branch circuit that carries the current pulses generated by the transmitter.

The disclosed transmitter embodiments include a pulse generator that supplies signal pulses to a bipolar constant current source (a "current pump"), which can produce current flow in either direction (i.e., can function both as a current source and a current sink). In response to the signal pulses, the current source periodically generates a sequence of two or more rectangular current pulses, which is supplied to an integrator circuit. In the disclosed embodiments of the invention, three current pulses are included in each sequence of current pulses.

In one arrangement of the invention, the transmitter includes a normally non-conducting voltage controlled switch to induce sequences of three current pulses of the type described above in the branch circuit being traced. During the period of time in which a current pulse supplied by the current source is positive, the integrator supplies a linearly increasing voltage that linearly drives the voltage controlled switch toward a conductive state. As a result, a low impedance load is connected between the hot and neutral leads of the branch circuit being traced to thereby cause substantial current flow in the branch circuit that linearly increases in the same manner as the linearly increasing voltage that is supplied by the integrator. A voltage limiter establishes the maximum voltage that can be supplied by the integrator. Thus, the voltage limiter limits the current flow that is induced in a branch circuit to a predetermined maximum value and maintains that maximum current until the end of the positive current pulse supplied to the integrator by the bipolar constant current source.

When the current pulse supplied by the constant current source goes negative, the voltage supplied by the integrator linearly decreases at the same rate as the increase that caused current flow in the branch circuit being traced. As a result, the voltage controlled switch returns to a non-conductive state, with the impedance of the voltage controlled switch increasing at a rate equal to the rate at which it decreased during the positive portion of the constant current pulse. Thus, the current pulse induced in the circuit branch being traced returns to zero and exhibits a linearly decreasing fall time that is equal to its linearly increasing rise time that is caused by the positive portion of the constant current pulse. Each current pulse in the sequence of current pulses induced in the circuit being traced is generated in the manner described above, with the intervals between current pulses preferably being not equal to one another.

In another arrangement of the invention, the voltage controlled switch is replaced by a current controlled switch that is driven by the voltage limiter. In this arrangement, the current controlled switch is linearly driven into a conductive state when the constant current source supplies a positive current pulse, with the maximum current flow through the switch being established by the voltage limiter. When the current pulse supplied by the constant current source goes negative, the current controlled switch linearly returns to a non-conductive state with the rate of change in conductance being equal to the rate at which the switch entered the conductive state. Thus, arrangements that utilize current controlled switches and those that utilize voltage controlled switches both induce current pulses in a branch circuit being traced in which the induced current pulses linearly increase and decrease with substantially identical rise and fall times.

As noted earlier, the handheld receivers that are used in the practice of the invention are positioned proximate individual circuit interrupters of the power distribution panel to detect the sequence of current pulses induced by the transmitter. The disclosed receiver embodiment includes a pickup coil for producing signals in responsive to electromagnetic energy coupled to the pickup coil by a proximate circuit interrupter and circuitry responsive to the signals provided by the pickup coil for providing an audible and/or visual signal when the signals produced by the pickup coil correspond to the sequence of current pulses induced in the branch circuit being traced.

The circuitry responsive to the signals provided by the pickup coil determines whether the duration (pulse width) of each pulse in a received sequence of current pulses substantially corresponds to the pulse width of the current pulses induced by the system transmitter and whether the timing between the received pulses corresponds to the timing between the pulses induced in the branch circuit being traced. In the disclosed embodiment, the receiver includes analog circuitry for differentiating the received current pulses and amplifying the differentiated signals. A microcontroller is employed to determine whether the duration of each pulse in a received sequence of current pulses substantially corresponds to the pulse width of the current pulses induced by the system transmitter and whether the timing between the received pulses substantially corresponds to the timing between the pulses induced in the branch circuit being traced. Specifically, upon determining that the first current pulse of a received pulse sequence has been detected, the microcontroller generates a signal pulse that resets the receiver circuitry and establishes gate signals that are timed to correspond to the times at which subsequent induced current pulses are expected to occur. Each gate signal is of a duration that slightly exceeds the duration of the current pulses provided by the system transmitter.

A signal representative of any pulse detected during the duration of each of the gate signals is coupled to an associated peak detector circuit. The signals provided by the peak detectors are summed with one another and supplied to a comparator circuit. If the sum of the signals provided by the peak detectors exceeds the comparator threshold, a sequence of current pulses that corresponds to the sequence induced in the branch circuit being traced has been received and the comparator provides an output signal that activates the receiver indicator circuit. If current pulses that correspond to the current pulses provided by the system transmitter are not received, the microcontroller produces an error signal that prevents the receiver indicator circuit from producing an indication that the correct circuit interrupter has been located and the receiver detection process begins again upon receipt of the next current pulse.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
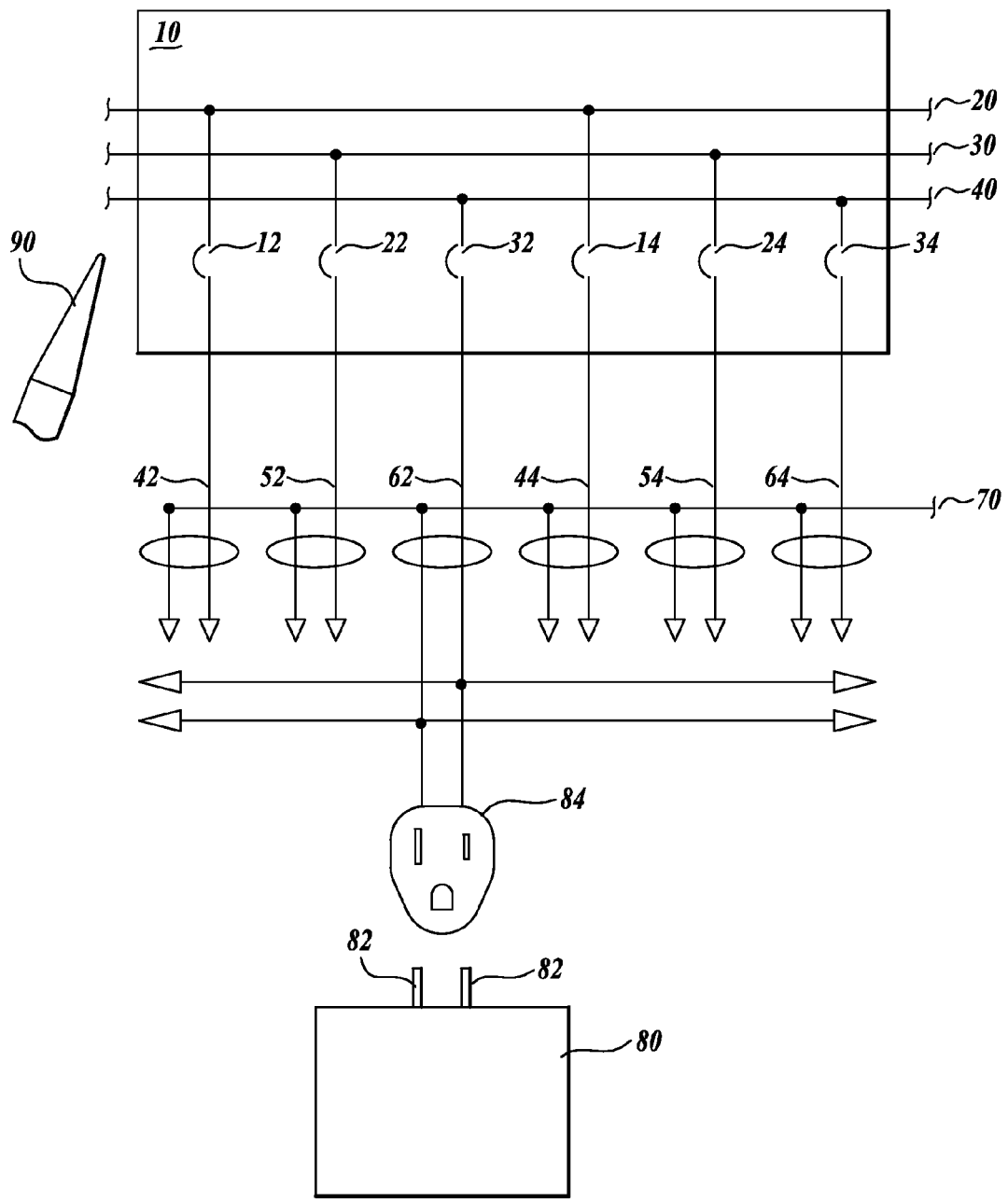
FIG. 1 is a wiring diagram that illustrates a power distribution panel that provides power to a plurality of branch circuits through associated circuit interrupters.

FIG. 1 illustrates a simplified wiring diagram that depicts a portion of a power distribution panel 10 having three power line bus bars 20, 30 and 40, and a plurality of circuit interrupters 12, 14, 22, 24, 32 and 34. In the depicted arrangement, circuit interrupters 12 and 14 form circuit paths between bus bar 20 and the "hot" leads of branch circuits 42 and 44; circuit interrupters 22 and 24 form circuit paths between bus bar 30 and the hot leads of branch circuits 52 and 54; and circuit interrupters 32 and 34 form circuit paths between bus bar 40 and hot leads of branch circuits 62 and 64. As is shown in FIG. 1, each branch circuit 42, 44, 52, 54, 62 and 64 includes a neutral lead 70 that together with the branch circuit's hot lead supplies power to loads that are connected to the respective branch circuits. Examples of loads that may be connected to the various branch circuits include permanently wired lighting systems, lamps and other appliances that may be removably connected to a branch circuit via conventional electrical receptacles and various equipment such as air conditioning and/or heating systems, refrigerators, cook stoves, washers and dryers that may be connected to a branch circuit via an electrical receptacle or permanently wired to a branch circuit. Although not shown in FIG. 1, the depicted branch circuits typically include a ground lead in order to provide ground fault protection.

As will be apparent to one of ordinary skill in the art, various circuit interrupters can be used in distribution panel 10 of FIG. 1. For example, circuit breakers of a standard design are installed in a majority of today's distribution panels, with receptacles for fuses being used in older electrical distribution systems. As used in describing the invention, a circuit interrupter is a circuit breaker, fuse, or any other device that opens the electrical circuit between a source of electrical current and a load circuit to protect against circuit overload (current that exceeds a specified current overload). Those of ordinary skill in the art will also realize that the electrical power distribution system shown in FIG. 1 is suitable for use in distributing three phase AC electrical power with the three phases of the electrical power that is supplied being individually connected to bus bars 20, 30, and 40. On the other hand, the arrangement of FIG. 1 can be used in a single phase AC system with the same electrical signal supplied to bus bars 20, 30 and 40. Even further, arrangements of the type shown in FIG. 1 can be used in DC power systems or systems that include both AC and DC branch circuits.

The present system for locating a circuit interrupter that is associated with particular branch circuit includes a transmitter and a receiver 80 and 90, respectively in FIG. 1. As is indicated in FIG. 1, transmitter 80 is arranged for electrical connection to a selected one of the branch circuits. In the depicted arrangement, transmitter 80 is shown as having a pair of spaced-apart conductors 82 that are received by a conventional electrical outlet 84 so as to electrically connect transmitter 80 to branch circuit 62. As is known in the art, other means exist for electrically connecting transmitter 80 with a branch circuit. For example, adapters are available for converting the pair of conductors 82 to electrical plug configurations that mate with variously configured electrical outlets that are used in the United States and other countries. Further, an adapter can be provided (or transmitter 80 can be otherwise configured) so that transmitter 80 can be electrically connected with various sockets of the type commonly used with incandescent and florescent lamps. As shall be described relative to FIGS. 2 and 3, the transmitter of the present invention induces a sequence of specifically configured current pulses in the branch circuit to which the transmitter is electrically connected.

Receiver 90 of FIG. 1 is a battery powered handheld device that includes a pickup coil for sensing the current pulses induced in a branch circuit by transmitter 80. In operation, and as shall be described in detail, receiver 90 is placed proximate individual circuit interrupters to detect the current pulses induced by transmitter 80. An audible and/or visual signal is provided by receiver 90 when it is located proximate the circuit interrupter that is associated with the branch circuit that carries the current pulses generated by transmitter 80. The located circuit interrupter can then be operated to remove power from the associated branch circuit (e.g., "tripped," in the case of a circuit breaker, removed in the case of a fuse).

Figure 2A:
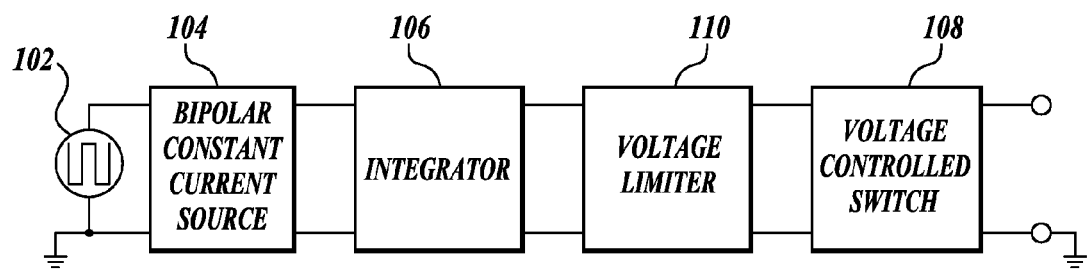
FIGS. 2A and 2B depict block diagrams of transmitters that can be used in the practice of the invention, with FIG. 2A depicting a voltage controlled switching arrangement and FIG. 2B depicting a current controlled switching arrangement.
Figure 2B:
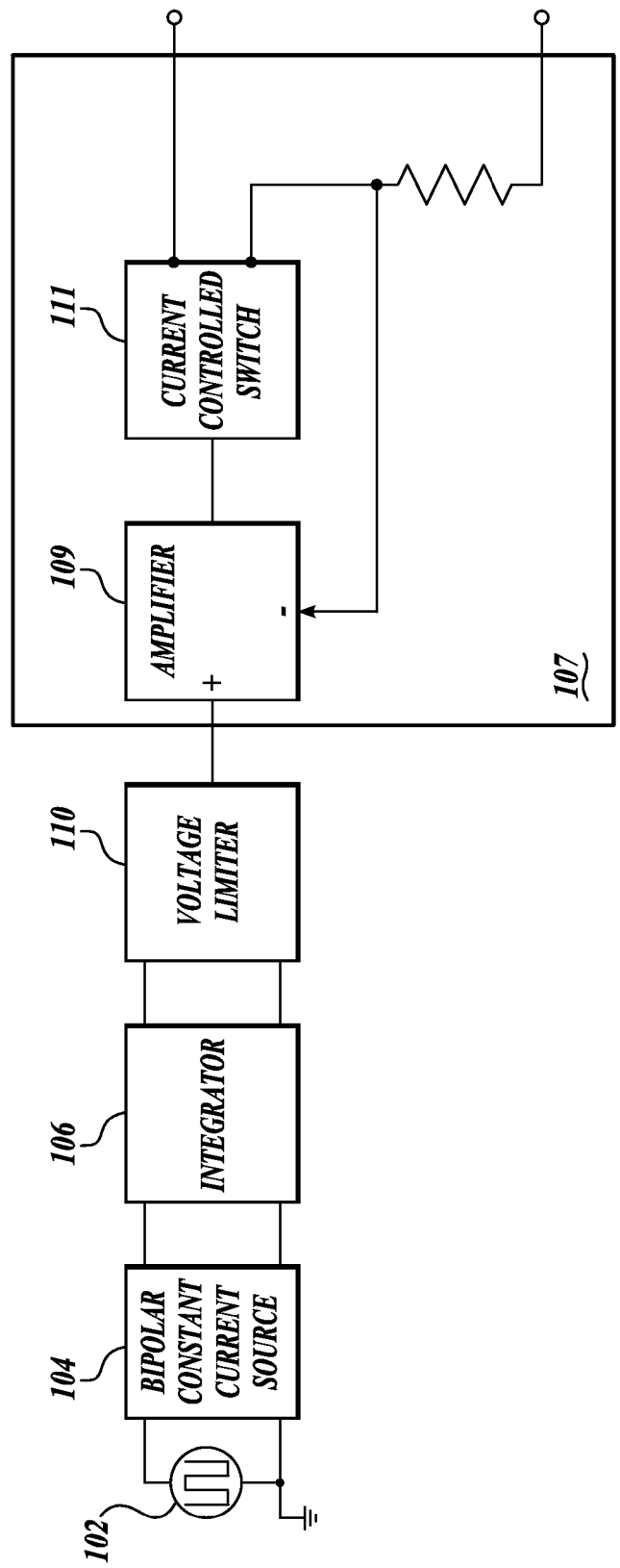

FIGS. 2A and 2B are block diagrams of transmitters that may be used in the practice of the invention. In FIG. 2A, a pulse generator 102 supplies a sequence of signal pulses to a current source 104. In the practice of the invention, each sequence of pulses supplied by pulse generator 102 consists of two or more pulses having a predefined timing relationship and duration. In one embodiment, the pulse generator may comprise a digital circuit or programmed processor that operates as a controller to output a sequence of three signal pulses. The pulse generator preferably spaces the timing of the signal pulses so as to avoid overheating the transmitter and so that the signal pulses to not occur at times that are harmonically related to the signals on the branch circuit or at times where noise in the branch circuit is likely to occur (e.g. at voltage peaks or minimums). In addition, the signal pulses can be output at time intervals that are predefined but are not equal to each other such that the time between successive pairs of signal pulses is not the same.

When used in an AC system, the transmitter can include a zero crossing detector for detecting zero signal crossings on the branch circuit. The transmitter then outputs the signal pulses at times that are defined with respect to a detected zero crossing. For example in a 3-phase system, the transmitter preferably outputs the signal pulses when the phase of the branch circuit into which the current pulses are to be induced is positive and the other phases of the 3-phase system are negative. When used in a DC system, the zero crossing detector does not detect a zero crossing within a certain amount of time and the transmitter is then programmed to output the sequence of signal pulses at predetermined times with respect to the first pulse.

In the depicted arrangement current source 104 is a bipolar constant current source (also referred to as a "current pump"), which can produce current flow in either direction (i.e., can function both as a current source and a current sink). For each pulse provided by pulse generator 102, current source 104 generates a rectangular current pulse, which is supplied to an integrator circuit 106. Thus, integrator 106 periodically receives a sequence of two or more constant current pulses.

When a current pulse supplied by current source 104 is positive, integrator 106 supplies a linearly increasing voltage to a voltage controlled switch 108 via a voltage limiter 110. The output terminals of voltage controlled switch 108 connect to a branch circuit that is to be traced to its associated circuit interrupter by means of a connector such as conductors 82 of transmitter 80 in FIG. 1. The linearly increasing voltage signal supplied by integrator 106 linearly drives voltage controlled switch 108 toward a conductive state. As a result, a low impedance load is connected between the hot and neutral leads of the branch circuit being traced to thereby cause substantial current flow in the branch circuit. In the arrangement of FIG. 2A, voltage limiter 110 establishes the maximum voltage that can be supplied to voltage controlled switch 108 by integrator 106. Thus, limiter 110 limits the current flow that is induced in a branch circuit to a predetermined maximum value.

When the positive portion of a current pulse supplied by current source 104 is terminated, the voltage supplied by integrator 106 linearly decreases. In the practice of the invention, the time interval between the current pulses generated by current source 104 is such that the output voltage supplied by integrator 106 causes voltage controlled switch 108 to be turned off. Further, the duration of the current pulses generated by constant current source 104 is such that voltage controlled switch 108 is in a conductive state for a relatively short period of time. That is, current pulses of relatively short duration are induced in a branch circuit that is being traced. For example, current pulses having rise and fall times on the order 65 microseconds and a pulse duration on the order of 200 microseconds may be used.

The transmitter shown in FIG. 2B includes a pulse generator 102, a current source 104, an integrator 106, and a voltage limiter 110 that are connected in the same manner as is shown in FIG. 2A and that operate as described above. The difference between the two depicted arrangements being that the arrangement of FIG. 2B utilizes a current controlled switching circuit 107 in place of the voltage controlled switch 108 that is employed in the arrangement of FIG. 2A. Specifically, the output of voltage limiter 110 in FIG. 2B is connected to the non-inverting input terminal of an amplifier 109 that supplies a signal to the input terminal of a current controlled switch 111. In this arrangement, one output terminal of current controlled switch 111 is connected to the hot lead of a branch circuit that is to be traced. The other output terminal of the current controlled switch is connected to the inverting input terminal of amplifier 109 and, in addition, to the neutral lead of the branch circuit via a resistor 113. In operation, the current supplied to current controlled switch 111 is directly proportional to the voltage supplied by voltage limiter 110. Thus, current controlled switch 111 operates to linearly switch between conductive and nonconductive states in the same manner as voltage controlled switch 108 of FIG. 2A.

Figure 3A:
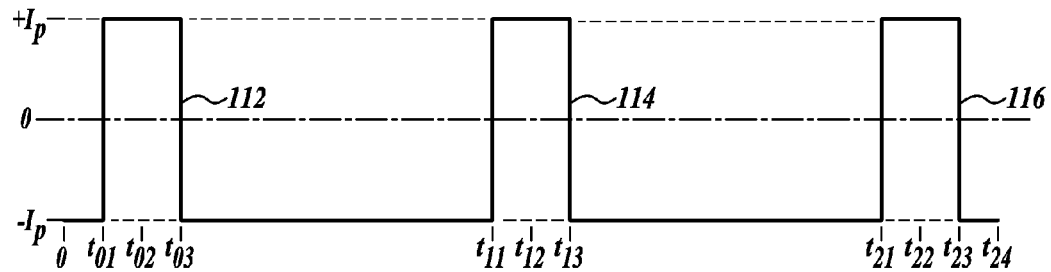
FIGS. 3A-3C depict waveforms generated by the various stages of the transmitters shown in FIGS. 2A and 2B.
Figure 3B:
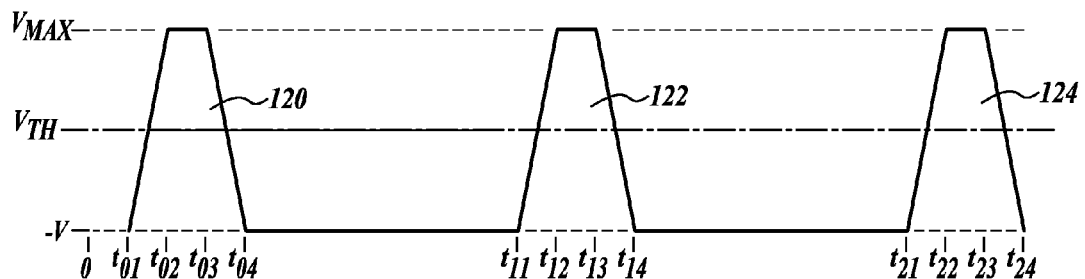
Figure 3C:
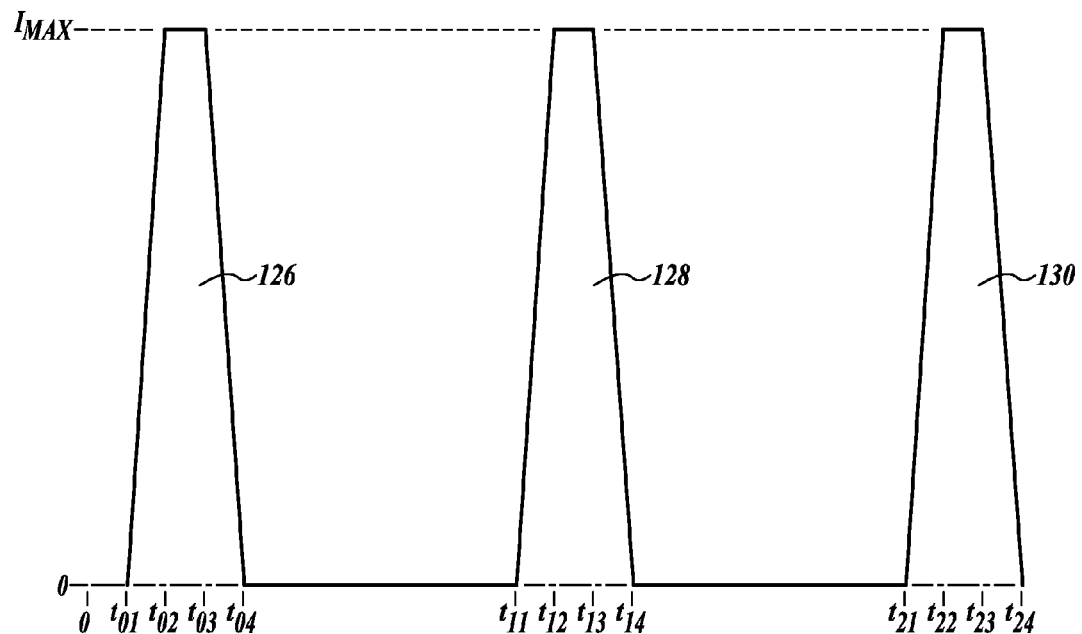

FIGS. 3A-3C depict operation of the arrangement of FIG. 2 wherein pulse generator 102 periodically supplies three signal pulses that result in the generation of three corresponding constant current pulses by bipolar constant current source 104 (signal pulses 112, 114, and 116 in FIG. 3A). Responding to the constant current pulses, integrator 106 supplies three voltage pulses (120, 122 and 124 in FIG. 3B) to the input of voltage control switch 108 of FIG. 2A. The voltage pulses switch voltage controlled switch 108 of FIG. 2A (or, alternatively, current controlled switch 111 of FIG. 2B) between conductive and nonconductive (ON and OFF) states in a substantially linear fashion. When voltage controlled switch 108 (or current controlled switch 111) is ON, a low impedance circuit path is established between the hot and neutral leads of the branch circuit being traced thereby generating current pulses 126, 128, and 130 of FIG. 3C.

More specifically, at time $t_{o1}$ in FIG. 3A, current pulse 112 switches from an initial negative current $(-I_p)$ to supply a constant positive current $(+I_p)$ during time interval $(t_{o1}-t_{o3})$. As a result, the output voltage 120 provided by integrator 106 rises linearly from an initial negative value $(-V)$. At time $t_{o2}$ in FIG. 3B, the output voltage of integrator 106 is clamped to a value $V_{MAX}$ by the limiter circuit 120 of FIG. 2A or 2B to establish the maximum voltage applied to the input of voltage controlled switch 108 (or maximum current drive to current controlled switch 111). Assuming voltage control switch 108 is connected across a branch circuit of an electrical distribution system and, further, that the transfer characteristic of the voltage controlled switch 108 or the current controlled switch being used is a constant, current flow through the voltage controlled switch will begin to linearly increase and linearly increasing current flow is induced in the branch circuit being traced (current pulse 126, FIG. 3C $t_{o1}-t_{o2}$).

In the case of voltage controlled switch 108, current will begin to flow between the hot and neutral leads of the branch circuit being traced when the voltage output of integrator 106 reaches the threshold voltage of the voltage controlled switch (e.g., $V_{th}$ volts). As the output voltage of integrator 106 continues to rise, current flow through the voltage controlled switch 108 linearly increases until the voltage output of integrator 106 reaches the voltage limited value of $V_{MAX}$ (at time $t_{o2}$ in FIGS. 3B and 3C). As is indicated in the idealized waveform diagrams of FIGS. 3A-3C, when the output voltage of integrator 106 reaches $V_{MAX}$, the current (126) flowing through voltage controlled switch 108 reaches a maximum value of $I_{MAX}$. Since the voltage supplied to voltage controlled switch 108 is clamped at $V_{MAX}$ by voltage limiter 110, current through the switch remains at $I_{MAX}$ until time $t_{o3}$, which is the time at which the output of constant current source 104 switches to $-I_p$ (FIG. 3A) and the voltage supplied by integrator 106 simultaneously begins to linearly decrease (FIG. 3B, time $t_{o3}$). The linear decrease in the output voltage of integrator 106 results in a corresponding linear decrease in current flow through voltage controlled switch 108 and, hence, a linear decrease in the current induced in the branch circuit being traced (current pulse 126 FIG. 3C $t_{o3}-t_{o4}$). In the exemplary, idealized waveform diagrams of FIGS. 3A-3C, at time $t_{o4}$ the output of integrator 106 reaches minimum voltage ($-V$, in the depicted arrangement), and the signal levels of the current supplied by current source 104 and the current flow through voltage controlled switch 108 are again at the initial values described relative to time $t_{o1}$. That is, the output of the constant current source is $-I_p$, and no current flows through voltage controlled switch 108.

The operation of a transmitter that employs a current controlled switch 111 differs from what is described above for voltage controlled switch 108 in that (a) the amplifier 109 of FIG. 2B provides an output current that is directly proportional to the signal produced by voltage limiter 110 (i.e., voltage pulse 120 of FIG. 3B); and (b) the current provided by amplifier 109 linearly drives the current controlled switch to produce current pulse 126 of FIG. 3C.

Regardless of whether a transmitter uses a voltage controlled switch or a current controlled switch, the operation described relative to time interval $t_{o1}$ to $t_{o4}$ is repeated during time intervals $t_{11}$-$t_{14}$ (constant current pulse 114 in FIG. 3A) and during the time interval $t_{20}$-$t_{24}$ (constant current pulse 116 in FIG. 3A). Thus, the pulse sequence described relative to FIG. 3 induces three current pulses 126, 128 and 130 in a branch circuit that is being traced. As is indicated in FIGS. 3A-3C, the idealized constant current pulses are identical in pulse duration and amplitude. However, the depicted current pulses do not exhibit a constant pulse repetition rate. That is, in the sequence of the three depicted current pulses, the time interval between the first and second pulse and the time interval between the second and third pulse are not equal to one another. As will be better understood upon understanding the operation of receivers that are configured to operate in accordance with the invention, either equally spaced or unequally spaced current pulses may be employed. However, unequal spacing of the current pulses can provide improved immunity from signal pulses that are induced in branch circuits of an electrical distribution system by devices such as light dimmers, motors and other such devices.

Figure 4A:
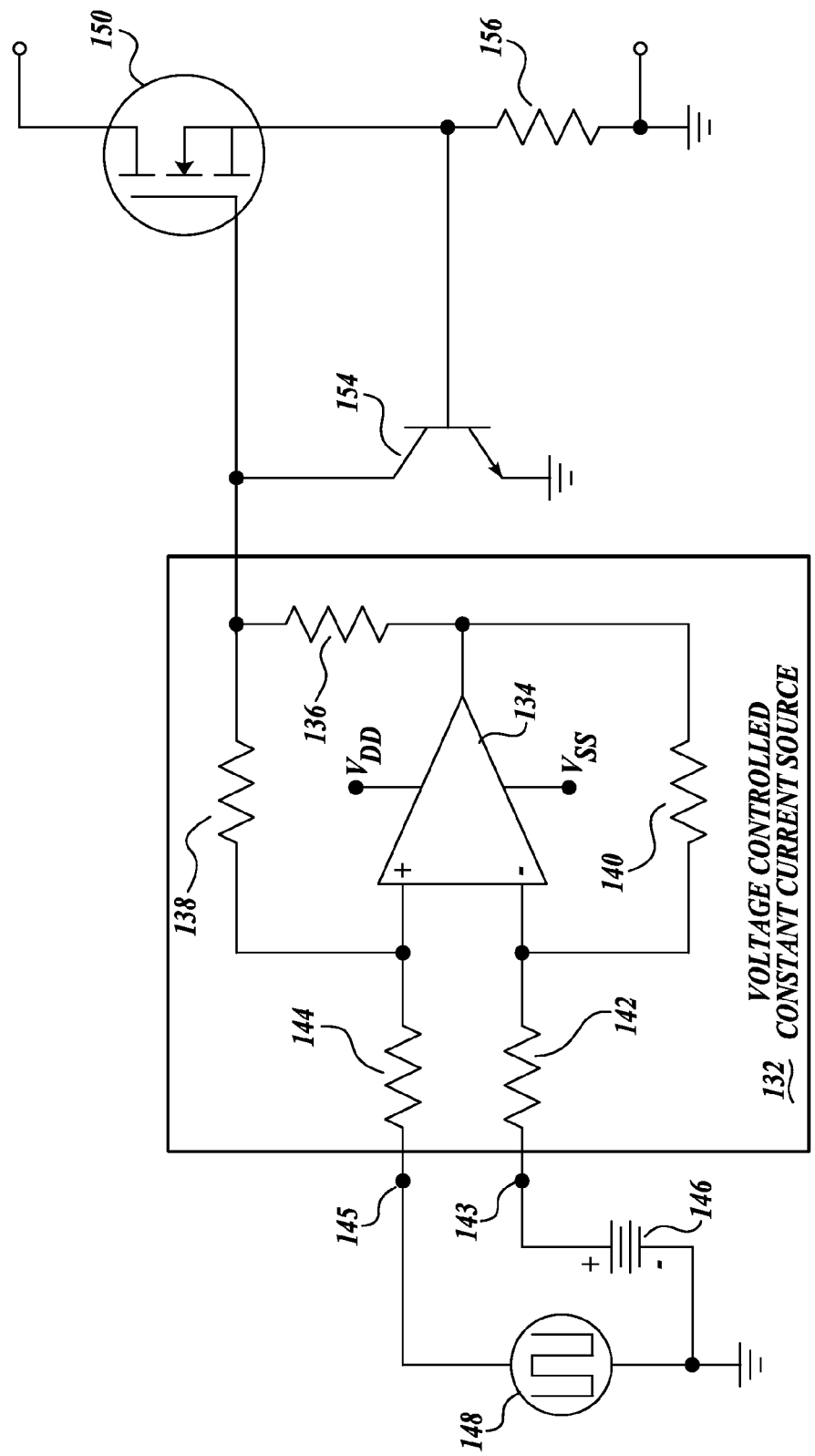
FIGS. 4A and 4B are schematic diagrams respectively illustrating embodiments of transmitters that correspond to the block diagram arrangements shown in FIGS. 2A and 2B.

FIG. 4A depicts a schematic diagram of one realization of the transmitter arrangement of FIG. 2A, thus depicting an arrangement that can be employed as transmitter 80 of FIG. 1. In FIG. 4A the constant current source 104 of FIG. 2A is a voltage controlled constant current source 132 that is within a class of circuits known as Howland current pumps. As can be seen in FIG. 4A, the depicted Howland current pump includes an operational amplifier 134. Connected between the output terminal of operational amplifier 134 and the non-inverting input is a positive feedback path consisting of serially connected resistors 136 and 138. Negative feedback is provided by resistor 140, which is connected between the output and inverting input terminals of operational amplifier 134. As is also shown in FIG. 4A, the inverting input terminal of operational amplifier 134 is connected to an input terminal 143 via a resistor 142 and the non-inverting input of operational amplifier 134 is connected to an input terminal 145 via a resistor 144. As is known in the art, the input resistors of a Howland current pump (resistors 142 and 144 in FIG. 4A) are typically equal in resistance value and are substantially greater in resistance than the resistance in the positive and negative feedback paths (resistance of resistor 140 in the negative feedback path and the sum of the resistance values of resistors 136 and 138 in the positive feedback path). Additionally, the resistance value of feedback resistor 140 is usually equal to the sum of the resistance values of positive feedback resistors 136 and 138. As will be recognized by those of ordinary skill, to achieve optimum performance of a Howland current pump, the resistance value of the two input resistors (142 and 144 in FIG. 4A) should closely match one another and the resistance value of negative feedback path resistor (140 in FIG. 4A) should closely match the sum of the resistance values in the positive feedback path (resistors 136 and 138).

The current supplied by a Howland current pump is proportional to the difference between the voltages that are supplied to the circuit input terminals (terminals 143 and 145, in FIG. 4A). In the arrangement of FIG. 4A, a positive DC potential is supplied to input terminal 143 (indicated by battery 146 but may be provided by a circuit that produces an accurate voltage signal) and a pulse generator 148 that supplies positive going voltage pulses is connected to input terminal 145. Preferably, the DC potential supplied to terminal 143 is equal to the one half of the peak voltage of the pulses supplied by pulse generator 148. In such an arrangement, the rise and fall times of the integrated current pulses will be substantially equal (e.g., the rise and fall times of voltage pulses 120, 122 and 124 in FIG. 3B).

In the arrangement shown in FIG. 4A, the voltage controlled switch (108 in FIG. 2) is an N-channel enhancement mode metal oxide field effect transistor (MOSFET) 150 that is switched between non-conducting and conducting states by current pulses that are provided by voltage controlled constant current source 132. In the depicted arrangement, the gate electrode of MOSFET 150 is connected to the junction between resistors 136 and 138 of voltage controlled constant current source 132. When pulse generator 148 of FIG. 4A causes voltage controlled constant current source 132 to supply a positive current (e.g., current $+I_p$ in FIG. 3A) the voltage, V, supplied to the gate electrode of MOSFET 150 is given by the expression $V=1/C\int idt$, where C is the gate to source capacitance of MOSFET 150 and i is the capacitor charging or discharging current. As described relative to FIG. 3, the current $I_p$ that is supplied to the gate of MOSFET 150 remains constant during time intervals $t_{01}$-$t_{03}$, $t_{11}$-$t_{13}$ and $t_{21}$-$t_{23}$. Thus, until limited to value $V_{MAX}$, (at times $t_{02}$, $t_{12}$ and $t_{22}$), the gate voltage of MOSFET 150 linearly increases at a time rate of change equal to $I_p/C$ during each of these intervals to produce the linear increases in the current pulses 126, 128 and 130 that are shown in FIG. 3C.

It will be recognized by those skilled in the art that the gate to source capacitance of MOSFET 150 is linearly discharged during time intervals $t_{03}$-$t_{04}$, $t_{13}$-$t_{14}$ and $t_{23}$-$t_{24}$ to cause a linear decrease in the current pulses 126, 128 and 130 at a time rate of change that also is equal to $I_p/C$.

In the arrangement of FIG. 4A, the voltage limiting function described relative to voltage limiter 110 of FIG. 2A is implemented by an NPN transistor 154. As shown in FIG. 4A, the collector electrode of NPN transistor 154 is connected to the junction between resistors 136 and 138 of voltage controlled constant current source 132; the emitter of NPN transistor 154 is connected to circuit common (ground); and the base electrode of the transistor is connected to the source electrode of MOSFET 150. In addition, the source electrode of MOSFET 150 is connected to circuit common (ground) via a resistor 156.

NPN transistor 154 operates in the following manner to limit the voltage at the gate electrode of MOSFET 150 and, hence, establish the maximum current of the current pulses induced in a branch circuit that is being traced (e.g., current $I_{MAX}$ of current pulses 126, 128 and 130 in FIG. 3C). As described above, when voltage controlled constant current source 132 supplies positive current flow, the gate to source capacitor of MOSFET 150 charges. As the gate voltage increases, the branch circuit causes a rapid increase in the drain to source current of MOSFET 150. The drain to source current causes NPN transistor 154 to conduct and thereby limit the gate voltage of MOSFET 150. It will be noted that the resistance of resistor 156 in the arrangement of FIG. 4A is relatively low and is selected to turn on NPN transistor 154 at a desired level of drain-to-source current flow through MOSFET 150. For example, in one embodiment of the invention configured for locating circuit breakers in a 110 volt AC electrical system, the resistance value of resistor 156 was 0.105 ohms.

Figure 4B:
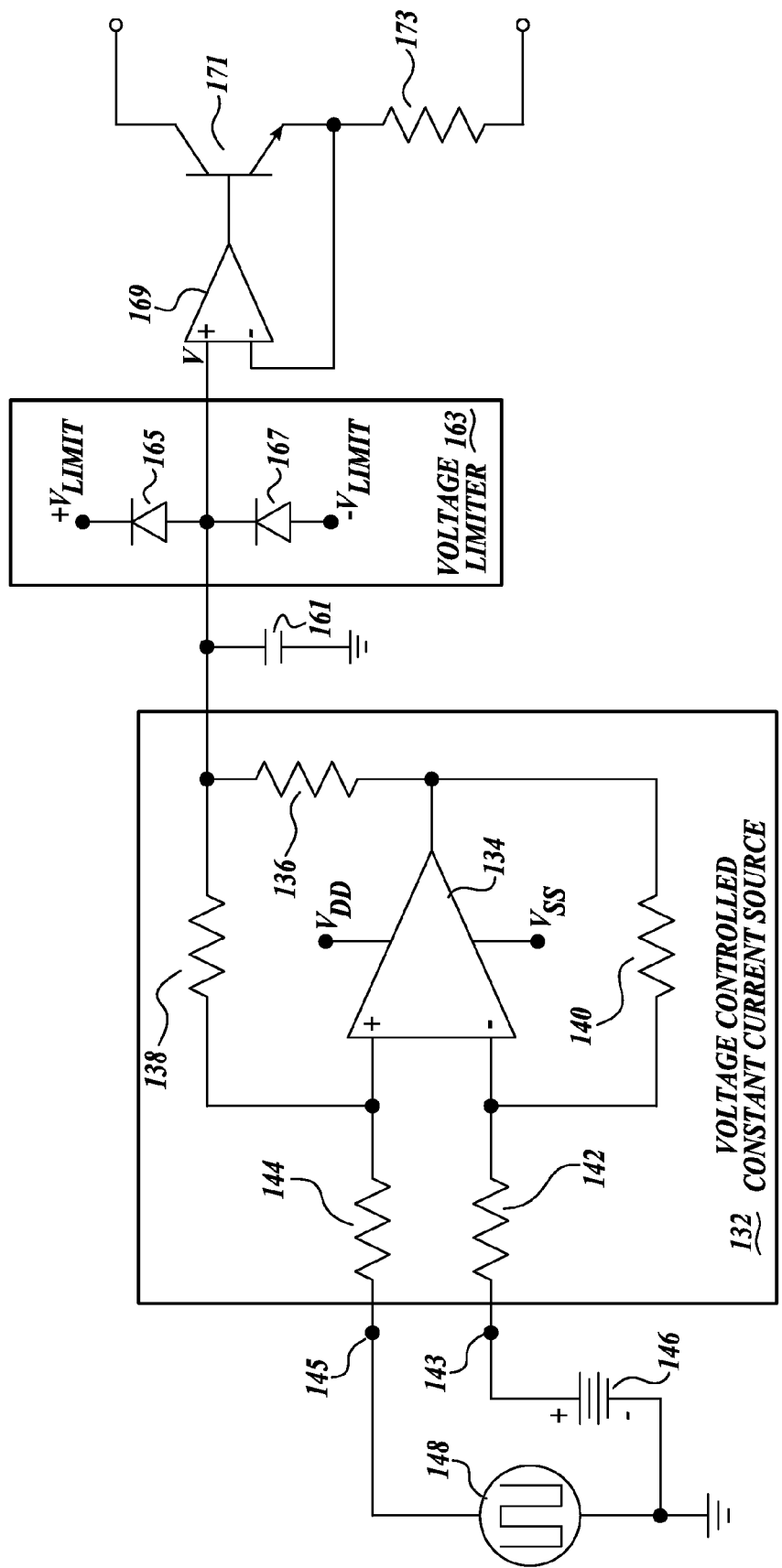

FIG. 4B schematically depicts an embodiment of a transmitter that corresponds to the arrangement shown in FIG. 2B, thus depicting an alternative to the above described arrangement of FIG. 4A. In the arrangement of FIG. 4B, a pulse generator 148 is connected to a voltage controlled constant current source 132 (e.g., a Howland current pump) in the same manner as described relative to FIG. 4A. Thus, the output of voltage controlled constant current 132 is a sequence of constant current pulses such as current pulses 112, 114 and 116 of FIG. 3A. In the arrangement of FIG. 4B, a capacitor 161 is connected between the output terminal of voltage controlled constant current source 132 and circuit common. A voltage limiter 163 is connected to capacitor 161 to clamp the maximum positive and negative capacitor voltages at predetermined values. In the depicted arrangement, voltage limiter 163 is a conventional clipper circuit that includes a diode 165 with the anode connected to capacitor 161 and the cathode connected to a positive voltage ($+V_{LIMIT}$ in FIG. 4B). The cathode of a second diode 167 is connected to capacitor 161 with the anode being connected to a negative voltage ($-V_{LIMIT}$ in FIG. 4B).

When the current supplied by voltage controlled constant current source 132 is at its maximum negative value (e.g., $-I_p$, at times less than $t_{01}$ in FIG. 3A), the output current of constant current source 132 flows through diode 167 to clamp the voltage of capacitor 161 at one diode drop below $-V_{LIMIT}$ (e.g., at a value that corresponds to $-V$ in FIG. 3B). When voltage controlled constant current source 132 switches between its maximum negative output current, $-I_p$, capacitor 161 begins to linearly charge with the capacitor voltage increasing at a rate equal to $I_p/C$, where C is the capacitance of capacitor 161. Once the capacitor voltage reaches one diode drop above voltage $+V_{LIMIT}$ in FIG. 4B, the current supplied by voltage controlled constant current source 132 flows through diode 165 to clamp the capacitor voltage at a predetermined level (e.g., $V_{MAX}$ at time $t_{02}$ in FIG. 3B). The capacitor voltage remains clamped throughout the remaining period of time that voltage controlled current source 132 supplies a positive output current (e.g., time interval $t_{02}$-$t_{03}$ in FIG. 3A).

When voltage controlled current source 132 switches between a positive and negative output current (e.g., at time $t_{03}$ in FIG. 3A), the current source acts as a current sink and capacitor 161 begins to charge in the negative direction with the capacitor voltage decreasing at a rate equal to $I_p/C$, where C is the capacitance of capacitor 161. Thus, the time rate of change of increasing capacitor voltage is identical to the time rate of change of decreasing capacitor voltage.

When the capacitor voltage reaches one diode drop below $-V_{LIMIT}$ (e.g., at time $t_{04}$ in FIG. 3B), the output current of constant current source 132 flows through diode 167 to clamp the voltage of capacitor 161 at one diode drop below $-V_{LIMIT}$ (e.g., at a value that corresponds to $-V$ in FIG. 3B). Current continues to flow through diode 165, maintaining the capacitor voltage at it maximum negative voltage (e.g., $-V$) until voltage controlled current source 132 again supplies a positive output current (e.g., at time $t_{11}$ in FIG. 3A).

In FIG. 4B, the current controlled switching circuit 107 of FIG. 2B is implemented by an operational amplifier 169 and an NPN transistor 171. In the depicted arrangement, the non-inverting input terminal of amplifier 169 is supplied with the above described signal provided by capacitor 161 and the amplifier output is coupled to the base electrode of NPN transistor 171. The emitter electrode of transistor 171 is coupled to the inverting input terminal of amplifier 169 and, in addition, is connected to a first output terminal of the depicted current controlled switching circuit via a resistor 173. The second output terminal of the depicted switching circuit is directly connected to the collector electrode of NPN transistor 171.

To trace a branch circuit, the output terminals of the depicted current controlled switching circuit are connected between the hot and neutral leads of the branch circuit. Operational amplifier 169 functions as a unity gain voltage follower that drives transistor 171. Thus, during periods of time in which the capacitor 161 supplies a positive voltage, the current flowing through transistor 171 (and, hence, induced in the branch circuit) is equal to $V_c/R_{173}$, where $V_c$ is the voltage supplied by capacitor 161, and $R_{173}$ is the resistance value of resistor 173. Since capacitor 161 supplies sequences of voltage pulses of the type shown in FIG. 3B, it can be seen that the arrangement of FIG. 4B induces current pulses in the branch circuit being traced that correspond to current pulses 126, 128 and 130 of FIG. 3C in that the current pulses exhibit equal rise and fall times and linearly increase and decrease at a rate determined by the integration of constant current pulses.

Having described various aspects of transmitters configured for use in the invention, attention is now directed to receivers that are configured for use with those transmitters. The basic configuration and operation of a receiver that is suitable for use in the invention can be understood in view of the type of current pulse sequences that are used in the practice of the invention.

As was described relative to FIG. 1, receivers used in the practice of the invention are battery powered handheld devices that include a pickup coil for sensing the current pulses induced in a branch circuit by the system transmitter. To locate the circuit interrupter associated with a branch circuit that is being traced, the receiver is placed proximate candidate circuit interrupters until a signal is electromagnetically coupled to the pickup coil that corresponds to the current pulses supplied by the system transmitter.

Receivers that are configured and arranged to operate in accordance with this invention process each sequence of current pulses induced in a branch circuit in accordance with the invention: (1) to detect the occurrence of the first pulse of a received sequence of current pulses; and, (2) to sample the signal received (induced in the receiver pickup coil) during periods of time at which the subsequent pulses of a sequence of current pulses would be expected to occur. For example, with respect to the sequence of current pulses shown in FIG. 3C, when a current pulse that corresponds to current pulse 126 of FIG. 3C is detected, the receive signal is sampled during a first sampling interval that begins at a time that is less than or equal to time $t_{11}$ and ends at a time that is equal to or greater than time $t_{14}$ in order to detect current pulse 128 of FIG. 3C. In a similar manner, the received signal is sampled for a second time during an interval that is less than or equal to $t_{21}$ and equal to or greater than $t_{24}$ in order to detect current pulse 130 of FIG. 3C.

Generating and sampling a sequence of current pulses in the described manner provides enhanced rejection of electrical system current pulses that are not induced by the system transmitter, thereby reducing the probability of falsely indicating that a circuit interrupter is the circuit interrupter associated with a branch circuit that is being traced. Specifically, a receiver operating in the described manner will not produce a signal indicating that a circuit interrupter has been located unless a sequence of current pulses is detected that at least closely matches the separation in time between the current pulses induced by the system transmitter.

To further increase noise immunity and provide improved operation, the receivers of the currently preferred embodiments of the invention function to determine whether the pulse width of each pulse in a received sequence of current pulses substantially corresponds to the pulse width of the current pulses induced by the system transmitter. Even further improvement is attained by sensing the amplitude of each pulse in a received sequence of current pulses to determine whether the received pulse amplitudes fall within an expected range that is based on the amplitudes of the current pulses induced in a branch circuit by the system transmitter.

There is yet another aspect of this invention that further increases system reliability and, in addition, alleviates a drawback of prior art systems. Specifically, preferably, the resistive component of the impedance of the pickup coil is substantially less than the inductive component. Thus, the pickup coil differentiates the received current pulses to produce positive going and negative going signal pulses of generally rectangular shape for each current pulse in a sequence of current pulses.

Figure 5:
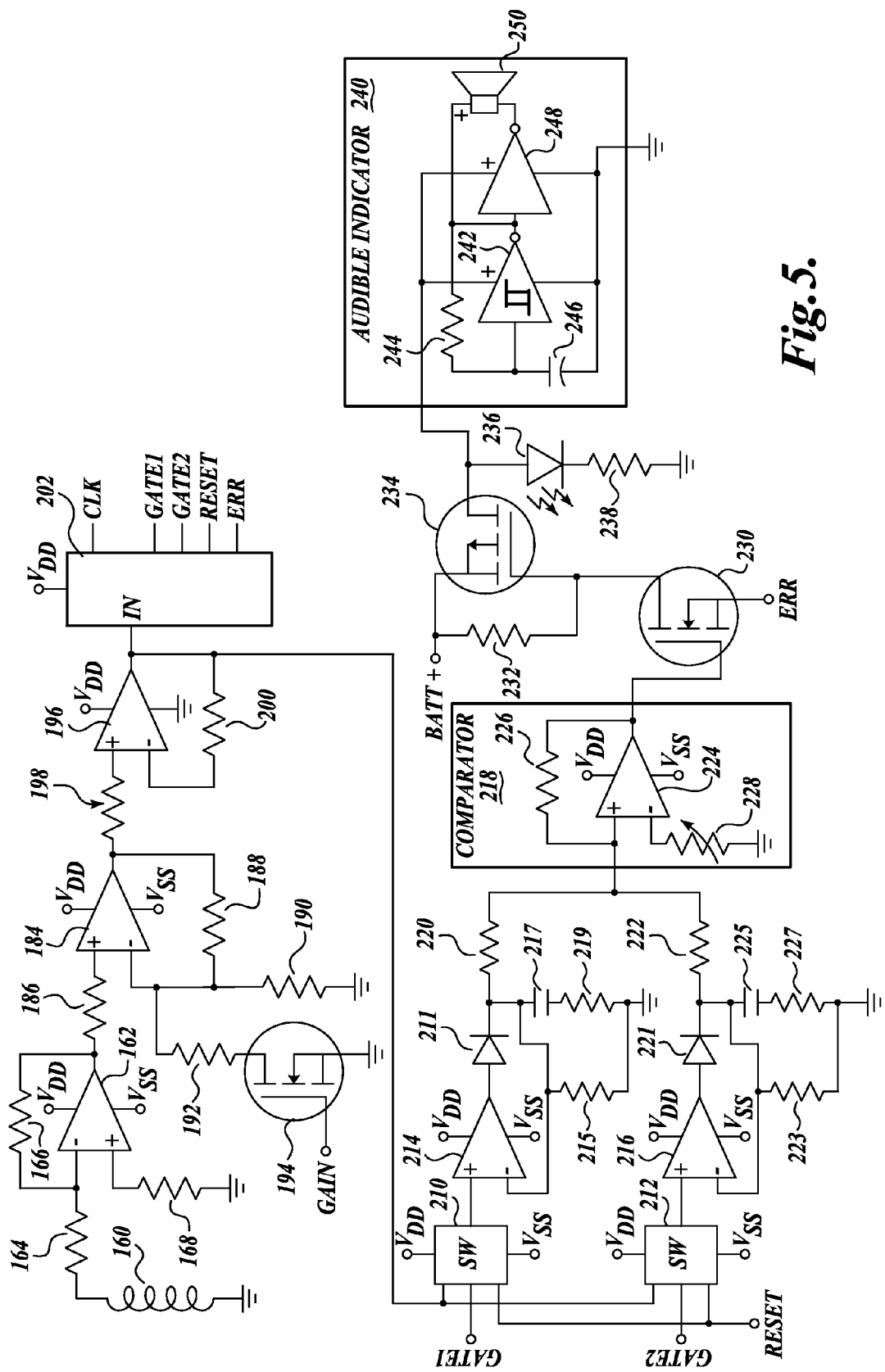
FIG. 5 is a schematic diagram of a receiver unit configured for use in one embodiment of the invention.

FIG. 5 is a circuit diagram depicting an exemplary receiver circuit configured to perform the above-discussed processing of sequences of current pulses that are induced in a branch circuit in accordance with the invention. In FIG. 5, a pickup coil 160 is connected to the inverting input of an operational amplifier 162 via a resistor 164. A resistor 166 is connected between the inverting input terminal and the output terminal of operational amplifier 162 to provide negative feedback and a resistor 168 is connected between the inverting input terminal of operational amplifier 162 and circuit common. Preferably, the inductance of pickup coil 160 is relatively low so that the transfer function of the circuit stage that includes pickup coil 160 and operational amplifier 162 corresponds to a first order filter in which the output provided by operational amplifier 162 increases with respect to increasing frequency of the signal that is electromagnetically coupled to pickup coil 160 from a branch circuit that is being traced. Thus, when the depicted arrangement is used with respect to AC electrical distribution systems, the frequency of the AC signal being supplied is below the filter function cutoff frequency. In one embodiment of the arrangement shown in FIG. 5, the inductance of pickup coil 160 was 556 microHenries.

Figure 6A:
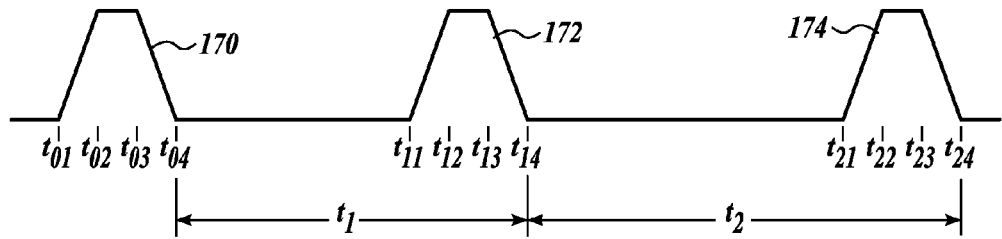
FIGS. 6A-D depict reset and gate signals generated by the receiver circuit of FIG. 5 and the relationship between those signals and signals induced in a branch circuit by transmitters of the type shown in FIGS. 2A and 2B; and, FIG. 7 is a flow diagram that illustrates an exemplary sequence of steps by which a receiver that is arranged in accordance with the invention processes the current pulses that are induced in a branch circuit being traced and are shown in FIG. 3C.
Figure 6B:
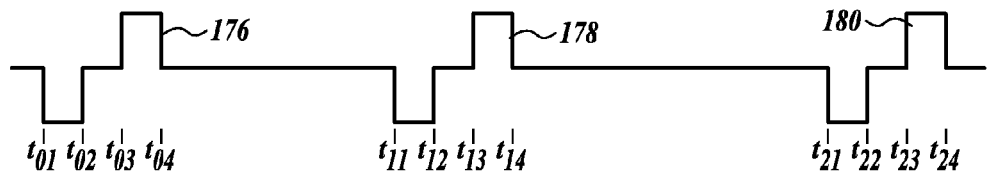

FIG. 6A and FIG. 6B respectively depict a series of current pulses induced in a branch circuit in accordance with the invention and the signal supplied by operational amplifier 162 of FIG. 5. Specifically, FIG. 6A depicts a sequence of three current pulses 170, 172, and 174 of the type induced in a branch circuit being traced. As was described relative to FIG. 3C, each current pulse includes a linearly increasing leading edge (e.g., time $t_{01}$-$t_{02}$ in current pulse 170), a constant current interval ($t_{02}$-$t_{03}$) and a linearly decreasing trailing edge ($t_{03}$-$t_{04}$ in current pulse 170).

As is known in the art, the voltage developed across an inductor is proportional to the first derivative with respect to time of the current that flows through the inductor. In the arrangement of FIG. 5, virtually all the current that is electromagnetically coupled to pickup coil 160 flows through the pickup coil. Thus, the pickup coil differentiates the current pulses that are induced in a branch current that is being traced. Thus, as is shown in FIG. 6B, a generally rectangular negative pulse is supplied by pickup coil 160 of FIG. 5 (and hence operational amplifier 162) during the linearly increasing portion of each current pulse 170, 172, and 174 of FIG. 6A; no output (zero volts) is supplied by the pickup coil and operational amplifier 162 during the interval of time in which the current pulses exhibit a constant current; and, a generally rectangular positive voltage pulse is supplied by pickup coil 160 during the linearly decreasing portions of each current pulse 170, 172, and 174 in FIG. 6A.

Returning to the circuit diagram of FIG. 5, the voltage pulses supplied at the output terminal of operational amplifier 162 (shown in FIG. 6B) are coupled to an amplifier stage that includes an operational amplifier 184. Specifically, in the depicted arrangement, the sequence of negative and positive rectangular voltage pulses supplied at the output terminal of operational amplifier 162 is coupled to the non-inverting input terminal of operational amplifier 184 via a resistor 186. Connected between the output and inverting input terminals of operational amplifier 184 is a resistor 188. Connected between the inverting input terminal of operational amplifier 184 and circuit common is a resistor 190. Connected in parallel with resistor 190 is a resistor 192 and the drain to source current path of an N-channel enhancement mode MOSFET 194. In this arrangement, the voltage gain of operational amplifier 184 is controlled by the drain to source resistance of MOSFET 194. Thus, the gain of the circuit stage can be adjusted by controlling the gate voltage supplied to MOSFET 194 with a potentiometer or other arrangement for providing a range of voltages (not shown in FIG. 5).

Figure 6C:
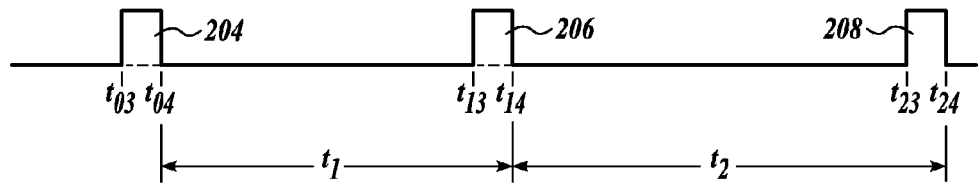

Continuing with the circuit diagram of FIG. 5, the voltage pulses provided at the output terminal of operational amplifier 184 are coupled to the non-inverting input of an operational amplifier 196 via a resistor 198. A feedback path is formed between the output and inverting input terminals of operational amplifier 196 by a resistor 200. Operational amplifier 196 functions as a half wave rectifier to eliminate the negative pulses of the signal provided by operational amplifier 184. Thus, as is shown in FIG. 6C, the output of operational amplifier 196 that corresponds to current pulses 170, 172, and 174 of FIG. 6A is a sequence of three positive rectangular voltage pulses 204, 206, and 208. Comparing FIG. 6A with FIG. 6C, it can be noted that the timing of the rectangular voltage pulses provided by operational amplifier 196 (FIG. 6C) corresponds to the timing of the detected current pulses 170, 172, and 174 of FIG. 6A. Specifically, the time interval $t_{04}$-$t_{14}$ denotes the time interval between the end of the first current pulse 170 and the second current pulse 172 and also denotes the time interval between the end of the first voltage pulse 204 and the second voltage pulse 206. Similarly, the time interval $t_{14}$-$t_{24}$ denotes the time interval between the end of the second current pulse 172 and the third current pulse 174 of FIG. 6A and additionally denotes the time interval between the end of the second rectangular voltage pulse 206 and the third rectangular voltage pulse 208 of FIG. 6C. Thus, voltage pulses 204, 206 and 208 are representative of current pulses 170, 172 and 174 in that the temporal relationship between the voltage pulses corresponds to the temporal relationship between the current pulses.

Returning to the circuit diagram of FIG. 5, positive voltage pulses 204, 206 and 208 are supplied by operational amplifier 196 to an input terminal of a micro controller 202 and, in addition, to the input terminals of a pair of sample and hold circuits.

As previously noted, to reliably locate the circuit interrupter of a branch circuit being traced, receivers that are configured and arranged in accordance with this invention function to process each sequence of current pulses that a transmitter induces in a branch circuit to determine whether the timing of the received current pulses substantially corresponds to the timing of the current pulses induced in a branch circuit by the system transmitter. The receiver produces an indication that the proper circuit interrupter has been located only if the timing of the received sequence of current pulses closely matches the timing of the current pulses induced in a branch circuit by the system transmitter. As also was mentioned, the receiver preferably determines whether the pulse width of each current pulse is substantially the same as the pulse width of the current pulses provided by the system transmitter. Further, the receiver preferably senses the amplitude of received current pulses and produces an indication that the proper current interrupter has been located only if the amplitudes of the received current pulses fall within an expected range of amplitudes.

Figure 6D:
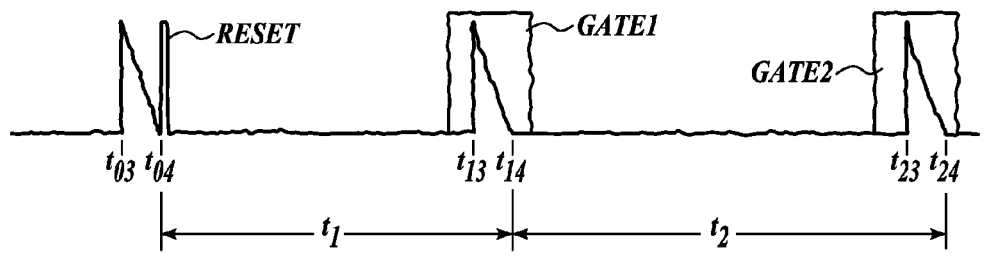

In the receiver arrangement of FIG. 5, microcontroller 202 functions in conjunction with switch circuits 210 and 212 to establish signal sampling intervals that are used to determine whether the timing between pulses in a received sequence of the current pulses sufficiently corresponds to the timing of a sequence of transmitted current pulses (i.e., a sequence of current pulses induced in the branch circuit being traced). FIG. 6D diagrammatically depicts operation of the circuit arrangement of FIG. 5 for the sequence of signal pulses described above relative to FIGS. 6A-C. As is indicated in FIG. 6D, A RESET pulse is generated by microcontroller 202 at time $t_{04}$, which corresponds to the trailing edge of rectangular voltage pulse 204 of FIG. 6C. As is shown in FIG. 5, the RESET pulse is coupled to switch 210 and 212, which results in switches 210 and 212 to switch to an open-circuit condition. In addition, the RESET pulse serves as a trigger to cause microcontroller 202 to generate two gate signals (GATE 1 and GATE 2) in FIGS. 5 and 6D. The GATE 1 signal causes switch 210 to switch to the closed-circuit state for the duration of the GATE 1 signal and the GATE 2 signal places switch circuit 212 in the closed-circuit condition for the duration of the GATE 2 signal. As is shown in FIG. 6D, the first gate signal, GATE 1, begins at a time that is slightly less than time $t_{13}$ and ends at a time that is somewhat greater than time $t_{14}$. As also is shown in FIG. 6D, the second gate signal, GATE 2, begins at a time that is slightly less than time $t_{23}$ and ends at a time that is somewhat greater than time $t_{24}$. Thus, it can be recognized that switch 210 will supply a signal identical to the signal provided by operational amplifier 196 while the GATE 1 signal is present and switch 212 (time interval $t_{13}$-$t_{14}$ of FIG. 6) and will supply the signal provided by operational amplifier 196 during the duration of the GATE 2 signal ($t_{23}$-$t_{24}$). Accordingly, it can be seen that switches 210 and 212 respectively function to provide signal samples that are representative of the signal provided by pickup coil 160 of receiver 90 during time intervals $t_{13}$-$t_{14}$ and $t_{23}$-$t_{24}$.

In the arrangement of FIG. 5, the output of switch 210 is connected to the non-inverting input terminal of an operational amplifier 214, which has its output terminal connected to the amplifier inverting input terminal via a diode 211. In this arrangement, diode 211 feeds the positive going portions of the operational amplifier output signal back to the amplifier inverting input terminal so that operational amplifier 214 provides an output signal that is substantially identical to the positive going portion of the signal provided to operational amplifier 214. In addition, the cathode of diode 211 is connected to circuit common via a resistor 215 and a signal path that is connected in parallel with resistor 215 and that includes a series-connected combination of a capacitor 217 and a resistor 219. In operation, capacitor 217 charges to the peak value of the signal that is supplied by operational amplifier 196 during the time interval $t_{13}$-$t_{14}$ of FIG. 6 and holds that value until microcontroller 202 generates another RESET pulse (not shown in FIG. 6). Thus, switch 210 and the circuit that includes operational amplifier 214 operate in conjunction with one another to serve as a sample and hold circuit that holds a dc voltage representative of the signal produced by receiver pickup coil 160 during the time interval $t_{13}$-$t_{14}$.

The circuit topology that is connected to switch 212 corresponds to the above describe circuit arrangement that is connected to the output of switch 210. Specifically, the output of switch 212 is connected to the non-inverting input terminal of an operational amplifier 216, which has its output terminal connected to the amplifier inverting input terminal via a diode 221. In this arrangement, diode 221 feeds the positive going portions of the operational amplifier output signal back to the amplifier inverting input terminal so that operational amplifier 214 provides an output signal that substantially identical to the positive going portion of the signal provided to operational amplifier 214. In addition, the cathode of diode 221 is connected to circuit common via a resistor 223 and a signal path that is connected in parallel with resistor 223 and that includes a series-connected combination of a capacitor 225 and a resistor 229. In operation, capacitor 225 charges to the peak value of the signal that is supplied by operational amplifier 196 during the time interval $t_{23}$-$t_{24}$ of FIG. 6 and holds that value until microcontroller 202 generates another RESET pulse (not shown in FIG. 6). Thus, switch 212 and the circuit that includes operational amplifier 216 operate in conjunction with one another to serve as a sample and hold circuit that holds a dc voltage representative of the signal produced by receiver pickup coil 160 during the time interval $t_{23}$-$t_{24}$.

Referring still to the arrangement of FIG. 5, the signal sample provided at the juncture between capacitor 217 and diode 211 is coupled to the input terminal of a comparator 218 via a resistor 220. Similarly, the signal sample provided at the junction between capacitor 225 and diode 221 is coupled to the input terminal of comparator 218 via a resistor 222. Thus, the input signal supplied to comparator 218 is equal to sum of the signal samples provided by the above described receiver circuitry during the time intervals $t_{13}$-$t_{14}$ and $t_{23}$-$t_{24}$ in the timing diagram of FIG. 6.

Comparator 218 of FIG. 5 includes an operational amplifier 224 having a resistor 226 connected between the amplifier output terminal and the inverting input terminal. A variable resistor 228 is connected between the amplifier non-inverting input terminal and circuit common. Connected to the output terminal of operational amplifier 242 is the gate electrode of an N-channel enhancement mode MOSFET 230.

As is known in the art, the output voltage produced by operational amplifier 224 is determined by the difference between the signal level at the inverting and non-inverting input terminals. Thus, variable resistor 228 can be set so that the output voltage of operational amplifier 224 does not turn on MOSFET 230 unless the sum of the signals supplied by sample and hold circuits 210 and 212 exceeds a predetermined level. Specifically, variable resistor 228 can be set so that operational amplifier 224 of comparator provides a positive gate signal to MOSFET 230 when a sequence of current pulses detected by the system receiver (e.g., the above discussed arrangement of FIG. 5) sufficiently correspond to a sequence of current pulses induced in the branch circuit being traced. In the practice of the invention, the required correspondence is with respect to the timing between pulses, pulse duration, and pulse amplitude.

For example, in terms of the waveforms shown in FIG. 6, the GATE 1 signal supplied by microcontroller 202 (FIG. 6D) is established so that it begins slightly before time $t_{13}$ and ends shortly after time $t_{14}$. Thus, the voltage pulse 206 of FIG. 6C that is produced by operational amplifier 196 of FIG. 5 in response to current pulse 172 occurs during (and is substantially equal in duration to) the GATE 1 signal. Similarly, the GATE 2 signal supplied by microcontroller 202 is established so that it begins slightly before time $t_{23}$ and ends shortly after time $t_{24}$. Thus, the voltage pulse 208 of FIG. 6C that is produced by operational amplifier 196 of FIG. 5 in response to current pulse 174 occurs during (and is substantially equal in duration to) the GATE 2 signal.

In view of the above discussed arrangement of FIG. 5, it can thus be recognized that the signal supplied to the input terminal of comparator 218 slightly after time $t_{14}$ (at the conclusion of the GATE 1 signal) is a DC voltage representative of the signal produced by pickup coil 160 during the period of time in which the second current pulse (172 in FIG. 6A) is induced in the branch circuit being traced. Moreover, it can be recognized that the signal supplied to the input terminal of comparator 218 increases at the conclusion of the GATE 2 signal (slightly after time $t_{24}$) by an amount that is representative of the signal produced by pickup coil 160 during the period of time in which the third current pulse (174 in FIG. 6A) is induced in the branch circuit being traced. Setting the width of GATES 1 and 2 only slightly greater than the time duration of signal pulses 206 and 208 (respectively) results in the input signal to comparator 218 being representative of (ideally, directly proportional to) the amplitude of the current pulses induced in the branch circuit and the proximity of the pickup coil to the correct branch circuit. Thus, an embodiment of the invention can be made such that comparator 218 switches MOSFET 230 to the ON state when the receiver 90 is sufficiently close to the branch circuit and the current pulses induced in the circuit path occur at the expected times.

Establishing the above described temporal relationship between the RESET pulse (time $t_{04}$ in FIG. 6D), the GATE 1 signal (time interval $t_{13}$-$t_{14}$) and the GATE 2 signal (time interval $t_{23}$-$t_{24}$) also establishes a dependant relationship between the pulse timing of current pulses being used to trace the branch circuit (i.e., current pulses 170, 172 and 174 in FIG. 6A) and the voltage supplied to the input of comparator 218 of FIG. 5. Thus, the invention can be embodied so that comparator 218 turns on MOSFET 230 when the timing of the signal pulses produced by the circuitry of receiver 90 sufficiently corresponds to the timing of the current pulses induced in a branch circuit being traced (e.g., current pulses 170, 172 and 174 in FIG. 6A). In the currently preferred embodiments of the invention, both the pulse width relationship and the pulse timing relationship that exists between the current pulses induced in a branch circuit being traced and the current pulses detected by the receiver are used to determine the voltage input to comparator 218 that will switch MOSFET 230 to the ON state. Even further, it can be noted that the amplitude of the pulses produced by the circuitry of receiver 90 (supplied by operational amplifiers 214 and 216 in FIG. 5) are directly related to the amplitude of the current pulses induced in the branch circuit being traced. Thus, currently preferred embodiments of the invention are arranged so that comparator 218 switches MOSFET 230 to the ON state only if the signal supplied to the comparator input indicates reception of a series of current pulses that correspond to a series of current pulses induced in a branch circuit being traced with respect to pulse timing, pulse width and pulse amplitude.

Turning again to the receiver circuitry of FIG. 5, the source electrode of MOSFET 230 is connected to an output port of microcontroller 202 (labeled ERR in FIG. 5) and the drain electrode is connected to a positive supply voltage labeled BATT+ via a resistor 232. In this arrangement, microcontroller 202 is programmed to maintain the ERR output port at circuit common (ground potential) during normal operation of the depicted receiver circuit. Thus, when comparator 218 switches MOSFET 230 to the ON state, the voltage at the junction of resistor 232 and the MOSFET drain electrode decreases from a value approximately equal to BATT+ to a value at or near circuit common. Also connected to the BATT+ supply voltage is the source electrode of a P-channel enhancement mode MOSFET 234 having its gate electrode connected to the junction between resistor 232 and the drain electrode of MOSFET 230. When MOSFET 230 is switched to the ON state (to designate the detection of the circuit interrupter of the branch circuit being traced), the gate to source voltage of MOSFET 234 becomes negative to drive MOSFET 234 into conduction. Thus, a positive voltage is supplied to the anode of a light emitting diode, which is connected to the drain electrode of MOSFET 234. As a result, current flows through light emitting diode (via resistor 238, which is connected between the cathode of light emitting diode 236 and circuit common) so that light emitting diode 236 provides a visual indication that the circuit interrupter of the branch circuit being traced has been located.

The arrangement of FIG. 5 also includes an exemplary audible indicator circuit 240 for indicating detection of the circuit interrupter associated with a branch circuit being traced. Audible indicator 240 of FIG. 5 includes a multivibrator formed by an inverting Schmitt trigger circuit 242 having a resistor 244 connected between its output and input terminals. A capacitor 246 is connected between the input terminal of Schmitt trigger circuit 242 and circuit common. As those skilled in the art will recognize, the multivibrator arrangement included in the audible indicator produces a square wave signal at a frequency that is determined by the RC time constant of resistor 244 and capacitor 26, whenever an operating voltage (BATTSW in FIG. 5) is supplied to Schmitt trigger circuit 242. Since BATTSW is supplied only when MOSFET 234 is in the conducting state, it can be recognized that Schmitt trigger circuit 242 will provide a square wave signal when a circuit interrupter is located that is associated with the branch circuit being traced.

Continuing with the description of audible indicator 240, the square wave signal supplied by Schmitt trigger circuit 242 is coupled to the input terminal of an inverter circuit 248. Connected between the output and input terminals of inverter 248 is a transducer 250 for producing an an audible audio output signal. In a prototype realization of the invention, a transducer referred to as an external drive piezoelectric diaphragm was employed as transducer 250. As noted above, Schmitt trigger circuit 242 produces a square wave signal when the circuit interrupter that is associated with the branch circuit being traced has been located. Thus, the exemplary receiver arrangement of FIG. 5 provides an audible signal indication as well as the visual indication provided by light emitting diode 236 when the circuit interrupter being sought has been located.

Although the embodiment disclosed uses an analog comparator circuit for measuring the output of the peak detectors, it will be appreciated that a suitably programmed controller or microprocessor with an analog-to-digital converter could be used to determine if the peaks of the signals detected are indicative of the current pulses induced by the transmitter and not noise.

Figure 7:
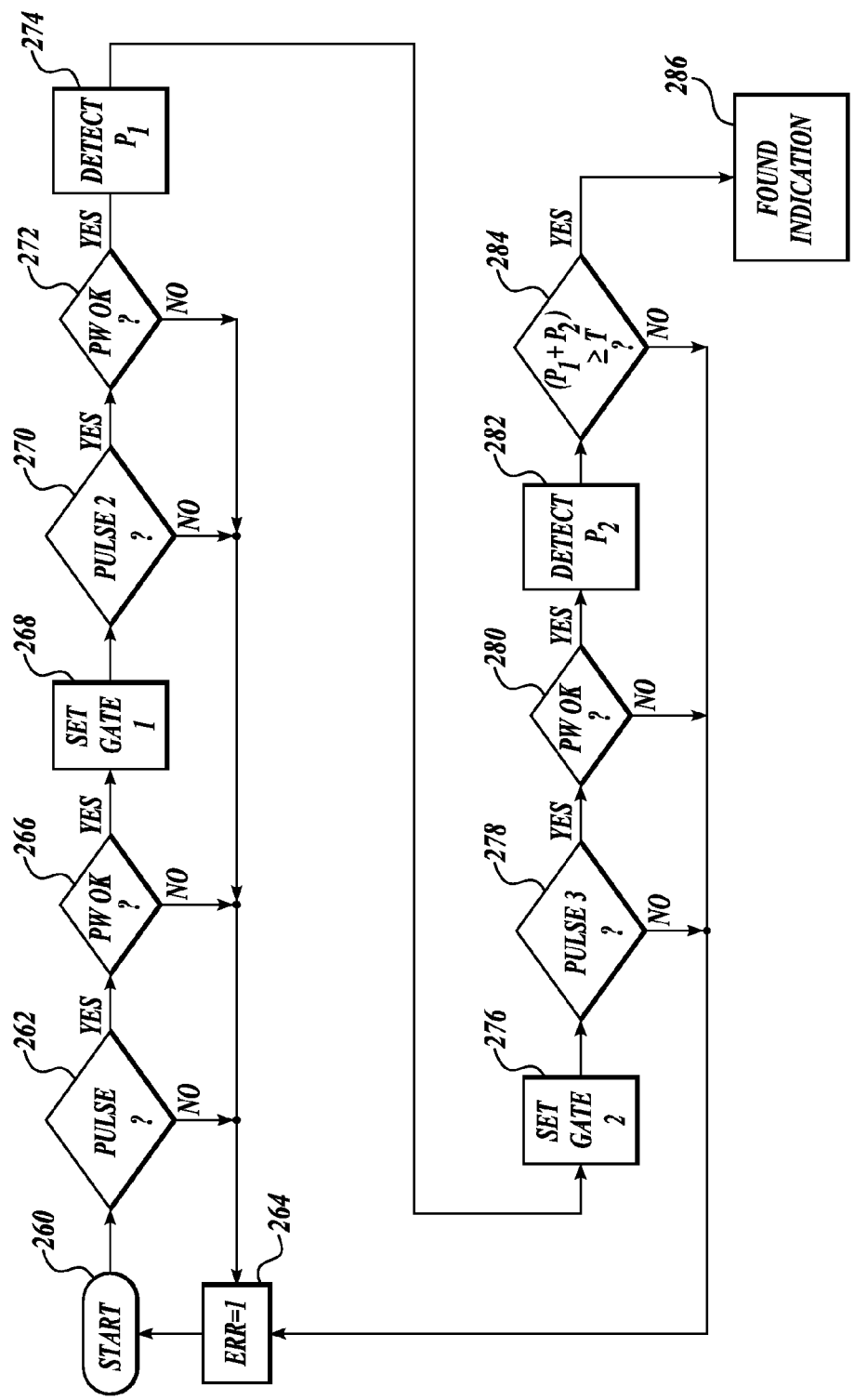

FIG. 7 is a flow diagram that provides a summary of the exemplary arrangement of the invention that is shown and described relative to FIGS. 1-6. Like the circuitry of FIGS. 4A, 4B and 5, exact correspondence to the steps described relative to FIG. 7 is not a required aspect of the invention, but simply provides one example of how the invention can be implemented. For example, the receiver circuit of FIG. 5 is advantageous in that the combined use of digital and analog circuitry provides a high degree of immunity with respect to signals induced in the branch circuits of a power distribution system by motors, light dimmers and other devices. However, the invention may be implemented entirely with analog or digital techniques. Moreover, various circuit arrangements can be used to provide the sample and hold, comparator, amplification, rectification, etc., functions described above relative to FIG. 5. The important thing is that the circuitry used to implement the invention and the exemplary processing described relative to FIG. 7 process a sequence of current pulses that generally correspond to the pulse shape that is shown in idealized form and described relative to FIG. 3C, and do so, in the manner described relative to FIGS. 6B-D.

In the example shown in FIG. 7, the process begins at START block 260, with the pickup coil of the receiver circuitry being held in close proximity to a circuit interrupter that may be associated with a branch circuit that is being traced. At block 262 the receiver circuitry determines whether a current pulse is present. If no pulse is present, the receiver circuitry, in effect, waits for a pulse to arrive. In FIG. 7, the process is shown as returning to START block 260 via block 264, which may be used to perform a function such as setting the ERR signal provided by microcontroller 202 of FIG. 5 to a value that prevents energizing the receiver indicator circuits (e.g., audible indictor 240 and light emitting diode 236 of FIG. 5). If it is determined at block 262 that a pulse is present, the duration of the pulse (pulse width) is determined at block 266. If the detected pulse width sufficiently matches the width of a current pulse induced in a branch circuit by the system transmitter (e.g., is within system design tolerance), a gate signal, (such as GATE 1 of FIG. 6D) is generated. In FIG. 7, the gate signal is set at block 268 and is established so that the receiver circuitry will determine whether a pulse is being received at a time that corresponds to the time at which the next current pulse is expected.

If a pulse is present during the time interval defined by the gate signal (determined at block 270), the width of the detected pulse is determined (at block 272). However, if no pulse is present during the time interval established by the gate signal, the sequence returns to start block 260. The sequence also returns to the start block if it is determined at block 272 that the pulse width of the pulse received by the receiver pickup coil does not sufficiently match the duration of a current pulse supplied by the system transmitter. In either case the sequence of FIG. 7 begins again when the next pulse arrives at the receiver pickup coil, If the pulse duration determined at block 272 sufficiently matches a transmitted current pulse, a signal representative of the amplitude of the pulse is stored (at block 274). This point in the sequence of FIG. 7 corresponds to the sample and hold operation described in terms of FIGS. 5 and 6 relative to switch 210 and the circuitry that includes operational amplifier 214.

Once a signal representative of the amplitude of the received pulse has been stored, a second gate signal is set (at block 276) so that the signal that is coupled to the receiver pickup coil will be sensed during a time duration that corresponds to the time period during which the next current pulse supplied by the system transmitter should arrive. If a pulse is not detected during the second gate period (at block 278), the sequence returns to start block 260 and begins again upon the detection of another current pulse. On the other hand, if a pulse is detected during the second gate period, a determination is made as to whether the pulse duration sufficiently matches the duration of a current pulse supplied by the system transmitter (at block 280). If the pulse duration is not of the proper duration, the sequence reverts to start block 260 to begin again when the next current pulse is detected. If the pulse duration determined at block 280 sufficiently matches a transmitted current pulse, a signal representative of the amplitude of the pulse is stored (at block 282). This point in the sequence of FIG. 7 corresponds to the sample and hold operation described in terms of FIGS. 5 and 6 relative to switch 212 and the circuitry that includes operational amplifier 216. Specifically, a sequence of three consecutive current pulses have been detected that likely correspond to a sequence of three current pulses that have been induced in a branch circuit being traced.

As is indicated at block 284, the signals that are representative of the amplitudes of the two detected current pulses are summed with one another, with the result being compared with a predetermined range of values that indicates that two received current pulses sufficiently correspond to two current pulses that were supplied by the system transmitter. If the comparison indicates that the sum of the two signals is outside an acceptable range, the sequence returns to start block 260 to begin again when a current pulse is coupled to the receiver pickup coil. If the comparison indicates that the two received current pulses sufficiently correspond to two current pulses that were supplied by the system transmitter, the receiver pickup coil is positioned proximate the circuit interrupter that is associated with the branch circuit being traced and a suitable audible and/or visual indication is generated (indicated at block 286).

As described above, the invention provides reliable detection of the circuit interrupter of a branch circuit being traced. In addition, there is yet another aspect of the invention that overcomes another drawback of prior art arrangements. Specifically, the circuit interrupters of conventionally configured power distribution panels are arranged in rows with a bus bar that provides power to the panel extending vertically to divide the distribution panel into left and right portions. In this arrangement, current flows from left to right through the circuit interrupters on the right side of the bus bar and current flows from right to left through the circuit interrupters that are located on the left side of the bus bar. Thus, the direction of incident magnetic flux (and resulting current flow) that is induced in a pickup coil reverses when the pickup coil is moved between the right and left sides of the distribution panel. In prior art devices, the flux reversal means that the pickup coil must be rotated by 180 degrees when it is moved between the two sides of a distribution panel so that that induced flux is in a required direction.

An embodiment of the invention overcomes the above described prior art drawback. As was described relative to FIGS. 2-4, transmitters configured in accordance with an embodiment of the invention produce a sequence of current pulses in which each current pulse linearly increases to a maximum value, remains at the maximum current value for a predetermined time, and then linearly decreases with a fall time that is equal to the pulse rise time. Examples of the current pulses are depicted in and were described relative to FIG. 3C, As was described relative to FIGS. 5-6, receivers configured in accordance with an embodiment of the invention differentiate the current pulses to produce equal duration positive-going and negative-going rectangular voltage pulses that are separated from one another by an interval of time that is equal to the period of time that the current pulses that are supplied by the transmitter remain at maximum current Examples of such voltage pulses are shown in idealized form in FIG. 6B. Half-wave rectification provided by the operational amplifier 196 eliminates the negative-going voltage pulses, thus converting a sequence of current pulses supplied by the system transmitter into a corresponding sequence of positive-going substantially rectangular voltage pulses. Thus, the receiver produces positive-going pulses on either the rising edge or the falling edge of the current pulse waveforms depending on the direction of current flow though the circuit interrupter. Because the rise time and falls times of the current pukes are equal, the receiver operates correctly regardless of which direction the current flows. Accordingly, in the practice of the invention, there is no need to rotate the receiver pickup coil by 180 degrees when moving it from one side of the distribution panel to the other. Although the preferred embodiment uses equal rise and fall times, it will be appreciated that the transmitter and receiver could operate where only the rise or the fall time of each current pulse is predefined for each current pulse.

From the standpoint of designing specific embodiments of the invention, it can be recalled that the time rate of change in the induced current pulse is established by the integration of constant current pulses, such as those provided by voltage controlled constant current source 132. Thus, in the design of embodiments of transmitters corresponding to FIG. 4A the gate to source capacitance of MOSFET 150 is selected in view of the maximum positive and negative currents provided by voltage controlled current source 132 to thereby establish a desired time rate of current change in the pulses that are induced in branch circuit being traced. In a like manner, in the design of embodiments of transmitters corresponding to FIG. 4B, the capacitance of capacitor 161 is selected in view of the maximum positive and negative currents provided by voltage controlled current source 132 to thereby establish a desired time rate of current change in the induced current pulses. Further, the rise and fall times of the induced current pulses preferably are established in view of the time constant associated with the receiver pickup coil (e.g., pickup coil 160 of FIG. 5 so that the voltage produced by the pickup coil is representative of the maximum value of the induced current pulses. Additionally, it is advantageous to establish the time interval during which the induced current pulses are at maximum value to exceed the time required for the receiver pickup coil to return to zero signal level following the time at which the induced current pulse reaches its maximum value. On the other hand, it is also desirable to maintain the time interval at which the induced current pulses are at maximum value to a minimum to thereby limit power the dissipation requirements of the voltage controlled switch that establishes the induced current pulses in the arrangements of FIGS. 2A and 4A and the current controlled switches in the arrangements of FIGS. 2B and 4B.

While illustrative embodiments have been illustrated and described, it will be appreciated that various changes can be made therein without departing from the spirit and scope of the invention. For example, although the presently preferred embodiment of the transmitter and receiver transmit and detect three current pulses, it will be appreciated that fewer than three current pulses or more than three current pulses could be used.

The invention claimed is:

1. A circuit for inducing current pulses into a branch circuit having an associated brand circuit interrupter for indentifying the branch circuit interrupter associated with such branch circuit, comprising:
    a transmitter configured for temporary interconnection with the branch circuit for inducing current pulses in the branch circuit, wherein each current pulse has a predetermined rise time during which the current magnitude increases linearly, followed by a predetermined period during which the pulse remains at a maximum current magnitude value, followed by a predetermined fall time of a duration substantially equal to the rise time and during which the current magnitude decreases linearly; and
    a controller that causes the transmitter to induce a sequence of current pulses in the branch circuit at time intervals that are predefined but are not equal to each other such that the spacing between successive pairs of pulses of the sequence is not the same.

2. The circuit of claim 1, wherein the transmitter is insertable into a branch circuit that carries AC signals.

3. The circuit of claim 1, wherein the transmitter is insertable into a branch circuit that carries DC signals.

4. The circuit of claim 1, including a receiver for indicating a circuit interrupter associated with the branch circuit into which the predefined sequence of current pulses has been induced, said receiver comprising:

a pickup coil for generate signals indicative of a rise time and fall time of a detected current pulse induced in the branch circuit;
    a pickup circuit coupled to the pick up coil, wherein the pickup circuit is configured to produce electronic signals representative of the signals generated by the pick up coil;
    a processor configured to analyze the electronic signals to determine if at least two sequential electronic signals occur within a predefined time interval and if the electronic signals indicate that detected current pulses have a rise or fall time that equals the predefined rise or fall time; and
    a human perceptible indicator controlled by the processor to alert a user that the receiver is in proximity to a circuit interrupter associated with the branch circuit if at least two sequential electronic signals are detected within the predefined time interval and if each of the detected current pulses has the predefined rise or fall time.

5. The circuit of claim 4, in which the receiver further comprises:
    at first gate circuit that is controlled by the processor during a time window after a current pulse is detected; and
    a first peak detector circuit configured to measures a peak magnitude of an electronic signal occurring during the time window,
    wherein the processor is configured to control the human perceptible indicator to alert a user if the electronic signal occurring during the first time window has a peak magnitude that is greater than a threshold level.

6. The circuit of claim 5, in which the receiver further comprises:
    a second gate circuit that is controlled by the processor during a second time window after a current pulse is detected;
    a second peak detector circuit configured to measure a peak magnitude of an electronic signal occurring during a second time window; and
    circuitry configured to sum the peak magnitudes of the electronic signals occurring during the first and second time windows, wherein the processor is configured to control the human perceptible indicator to alert a user if the sum of the peak magnitudes is greater than a threshold level.

7. The circuit of claim 4, wherein the pickup circuit includes a half wave rectifier that produces electronic signals of the same polarity regardless of the direction of current flow of a current pulse in the branch circuit with respect to the pick up coil.

8. A system for detecting a circuit interrupter associated with a particular branch circuit, comprising:
    transmitter means for inducing current pulses in a branch circuit, each of said current pulses increasing linearly during a predetermined rise time, remaining at a maximum current value for a predetermined time, and decreasing linearly with a fall time substantially equal to the current pulse rise time;
    control means that causes the transmitter means to create current pulses at time intervals that are predefined but are not equal to each other such that the spacing between successive pairs of pulses of the sequence is not the same; and
    a probe means for detecting the current pulses at a circuit interrupter and for alerting a user when the probe means is in proximity to a circuit interrupter associated with the branch circuit in which the current pulses are created if at least some of the detected current pulses are detected at the predefined time intervals and if each of the detected current pulses has the predefined rise or fall time.

9. A system for locating a wire in which one or more current pulses are induced, comprising:
- a transmitter configured to induce a current pulse in the wire, wherein the magnitude of the current pulse increases linearly during a predetermined rise, remains at a maximum current value for a predetermined time, and decreases linearly during a predetermined fall time;
- a controller that causes the transmitter to induce a sequence of current pulses in the wire, at the time intervals that are predefined but are not equal to each other such that the spacing between successive pairs of pulse of the sequence is not the same; and
- a detector circuit configured to produce an indication that the detector circuit is in proximity to the wire in which the sequence of current pulses are induced, the detector circuit including:
  - a pickup coil for configured to generate signals indicative of a rise time or fall time of a detected current pulse induced in the wire;
  - a pickup circuit coupled to the pickup coil, wherein the pickup circuit is configured to produce electronic signals representative of the signals generated by the pickup coil; and
  - a processor configured to analyze the electronic signals to determine if at least two sequential electronic signals occur within a predefined time interval and if the electronic signals indicate that detected current pulses have a rise or fall time that substantially equals the predetermined rise or fall time.

10. The system of claim 9, further comprising:
a human perceptible indicator controlled by the processor to alert a user that the receiver is in proximity to the wire in which the sequence of current pulses is induced.

11. The system of claim 9, wherein the detector circuit further includes:
- at least one gate circuit that is controlled by the processor during a time window after a current pulse is detected; and
- a peak detector circuit configured to measure a peak magnitude of an electronic signal occurring during the time window,
wherein the detector circuit produces an indication that the detector circuit is in proximity to the wire in which the sequence of current pulses are induced if the electronic signal occurring during the time window has a peak magnitude that is greater than a threshold level.

\* \* \* \* \*